United States Patent [19]

Yamashita et al.

[11] 4,310,734

[45] Jan. 12, 1982

[54] ELECTRIC CIRCUIT UNIT

[75] Inventors: Maki Yamashita; Shinji Tominaga, both of Sakai, Japan

[73] Assignee: Minolta Camera Kabushiki Kaisha, Osaka, Japan

[21] Appl. No.: 37,306

[22] Filed: May 8, 1979

[30] Foreign Application Priority Data

May 9, 1978 [JP] Japan ................................. 53-55316

[51] Int. Cl.³ .......................................... H01H 21/62
[52] U.S. Cl. .............................. 200/11 R; 200/11 G; 200/11 K; 200/302
[58] Field of Search ............. 200/11 R, 11 D, 11 DA; 200/11 G, 11 K, 11 TW, 11 J, 17 R, 18, 302, 303

[56] References Cited

U.S. PATENT DOCUMENTS

| | | | |
|---|---|---|---|
| 3,437,766 | 4/1969 | Ahrens | 200/11 K |
| 3,809,830 | 5/1974 | Lockard et al. | 200/11 TW |
| 3,858,202 | 12/1974 | Boulanger | 200/5 A X |
| 3,900,709 | 8/1975 | Sheesley et al. | 200/11 R X |

FOREIGN PATENT DOCUMENTS 52-33327  3/1977  Japan .

*Primary Examiner*—Gene Z. Rubinson
*Attorney, Agent, or Firm*—Watson, Cole, Grindle & Watson

[57] ABSTRACT

An electric circuit unit includes a through-hole type plate on one side of which is printed an electrical circuit including switch terminals and on the other side of which are attached electrical circuit elements such as resistors, capacitors and semiconductor elements. An electrically-insulating protective cover is attached to the plate so as to cover the switch terminals provided on the plate. The protective cover supports elements which include movable switch contacts which are engageable with the switch terminals provided on the plate.

8 Claims, 3 Drawing Figures

ELECTRIC CIRCUIT UNIT

BACKGROUND OF THE INVENTION

The present invention relates generally to an electric circuit unit wherein electrical circuit elements such as resistors, capacitors and semiconductor elements, as well as switches, are provided on a plate or a substrate.

An electric circuit unit for use in cameras and the like which is known in the prior art has several inherent disadvantages. The known electric circuit unit has various circuit elements and switches provided on only one surface of a plate or substrate on which an electric circuit is printed, which thereby results in the disadvantage that an increased space for the unit is required. Consequently, this prior art electric circuit unit has been generally unfit for use in a confined space such as in a camera. Furthermore, these units have a plate on which switch contacts are disposed, and a member for supporting movable contacts adapted to slide on the switch contacts of the unit is separately mounted in the body itself, for example, in a camera. Therefore, checking and adjustment of the functioning and performance of the electric circuit unit cannot be accomplished unless all of the members constituting the electric circuit unit are mounted in the body itself, which causes extreme inconvenience in quality control during manufacture of the units. In addition, in the prior art electric circuit unit, the contact portions of the switches and the slidable contacts thereof remain exposed before the unit is assembled and even after the unit has been mounted in a body such as a camera. As a consequence, during assembly or after the unit has been in service for a long period of time, for example, in a camera, dust or the like tends to accumulate and cling to the contact portions and/or slidable contacts of the switches, which may lead to a defective electrical connection.

SUMMARY OF THE INVENTION

Accordingly, it is a primary object of the present invention to provide an improved electric circuit unit.

It is another object of the present invention to provide an electric circuit unit which has reduced dimensions as compared with the units of the prior art, and in which the functioning and performance of the unit can be checked and adjusted as an independent unit prior to the incorporation of the unit into a body such as a camera.

It is a still further object of the present invention to provide an electric circuit unit where the switching portions are protected from dust and the like.

Briefly, these objects are achieved in accordance with the present invention by an electric circuit unit which comprises a substrate having front and rear surfaces, wherein an electrical circuit is printed on the front surface of the substrate, wherein at least one electrical circuit element is provided on the rear surface of the substrate, and wherein a cover means is attached to the substrate, the cover means covering at least a portion of the electrical circuit printed on the front surface of the substrate for insulating the circuit from dust.

The present invention further comprehends an electric circuit unit which comprises a substrate having a front surface, an electrical circuit printed on the front surface of the substrate, the electrical circuit including of at least one group switch terminals, a cover member attached to the substrate, and a movable contact element having switch contacts for selectively electrically bridging some of the switch terminals in each of the groups of switch terminals, each movable contact member being supported by the cover member.

DESCRIPTION OF THE PREFERRED EMBODIMENTS

The present invention will be described in greater detail hereinafter in conjunction with the accompanying drawings.

Figure 1:
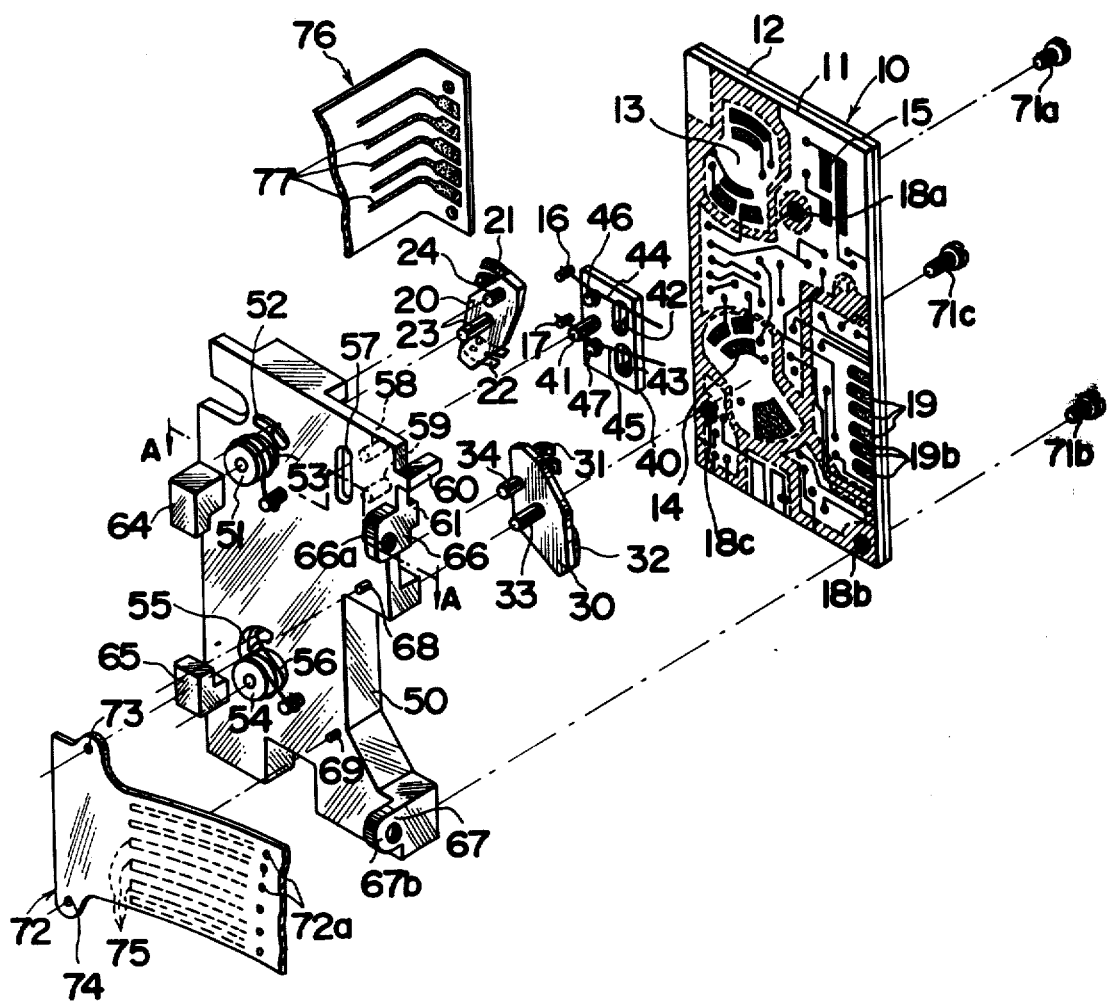
FIG. 1 is an exploded perspective view of an electrical circuit unit according to the present invention.
Figure 2:
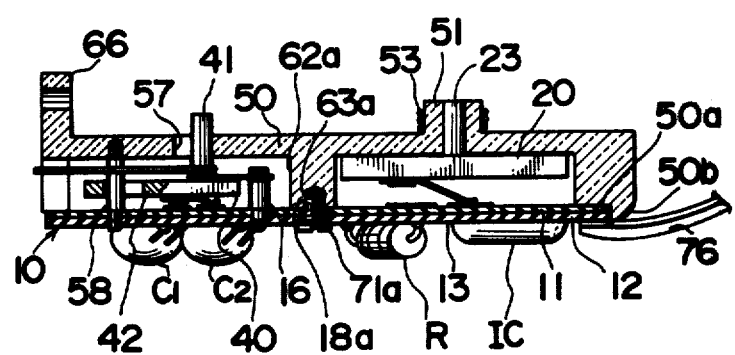
FIG. 2 is a cross-sectional view taken along the line A—A of FIG. 1.

FIG. 1 is an exploded perspective view of an electric circuit unit according to one embodiment of the present invention and FIG. 2 is a cross-sectional view of an essential portion of the assembled unit. Briefly, the electric circuit unit of FIGS. 1 and 2 includes an insulative substrate or plate 10 on which an electrical circuit is printed, a protective cover 50 of an electrically-insulating material for covering one surface of the plate, and holder elements 20, 30 and 40 for supporting the movable contacts of switches between the plate and the protective cover. Flexible substrates 72 and 76 having printed conductor strips are used to electrically connect the electric circuit unit to other circuits (not shown).

Plate 10 consists of two plate-like print substrates 11 and 12, both of which are provided with through-holes at two or more locations such that the through-holes in one substrate are in register with those in the other substrate when both the substrates are placed one upon another and joined together into an integral body. Print substrates 11 and 12 each have a conductive pattern printed on the exposed surfaces thereof. The conductive patterns of both substrates 11 and 12 are electrically connected to each other by means of conductive members piercing through the through-holes of the substrates. As shown in FIG. 2, print substrate 12 has circuit elements such as resistor R, capacitors C1 and C2, a semiconductor element and IC module labeled IC attached to given portions of one surface thereof. Print substrate 11 has rows of switch terminals in parallel to the loci of movable switch contacts which will be described hereinafter. More specifically, print substrate 11 includes a first group of switch terminals 3 adapted to be slidingly contacted by the movable switch contacts 21 and 22 retained on holder element 20, a second group of switch terminals 14 adapted to be slidingly contacted by the movable switch contacts 31 and 32 retained on element holder 30, and a third group of switch terminals 15 adapted to be slidingly contacted by the movable switch contacts (not shown) retained on holder element 40.

Holder element 20 includes a cylindrically-shaped shaft 23 which is rotatably supported when the unit is assembled by bearing 51 provided on protective cover 50, and it also includes control pin 24 which fits into arcuate slot 52 in the protective cover when the shaft 23 projects through the through-hole in the bearing of the protective cover. One end of a coil spring 53 is hooked to pin 24 to bias holder element 20 clockwise. Holder element 30 includes a cylindrically-shaped shaft 33 which is rotatably supported by a through-hole in bearing 54 of protective cover 50, and it also includes a pin 34 which fits into arcuate slot 55 in the protective cover and on which one end of coil spring 56 is hooked to bias holder 30 clockwise. Holder elements 20 and 30 are thus free to rotate by turning either shafts 23 and 33, or pins 24 and 34 respectively, from the exterior of protective cover 50.

Holder element 40 is retained by protective cover 50 such that the holder element can slide vertically as viewed in FIG. 1. More specifically, holder element 40 includes operating pin 41 which fits into guide slot 57 in protective cover 50 and slots 42 and 43 which respectively receive pins 58 and 59 attached to the protective cover. Since pins 58 and 59 fit in these slots 42 and 43, holder element 40 may be moved vertically by operating pin 41 from the exterior of the unit. Springs 44 and 45 which bias holder element 40 upwardly are wound to pins 46 and 47 attached to the holder element and have one end resiliently connected to the tips of pins 16 or 17 integral with print substrate 11 and the other end hooked onto projecting portions 60 or 61 of protective cover 50. If holder element 40 is moved downwardly against the force of springs 42 and 43 by means of operating pin 41, then the movable switch contacts provided on the reverse surface of the holder element will slide along the third group of switch terminals 15.

A switch structure may be obtained if pins 58 and 59 projecting from the reverse surface of protective cover 50 are made of electrically-conductive metal or if the peripheral portions of the pins are covered with a layer of electrically-conductive metal, and springs 44 and 45 are made of a metallic material so that such electrically-conductive portions are connected to an external electrical circuit or print substrate 11 or 12 and the springs are connected to a given electrical circuit portion. In such a structure, the downward movement of holder elements 40 brings springs 44 and 45 into contact with pins 58 and 59, respectively, so as to thereby close the switch terminals. If the relative position of pins to springs is properly determined, then the timing of the engagement of one pin with one spring can be made different from the timing of the engagement of the other pin with the other spring.

As shown in FIG. 1, the projecting portion of the reverse surface of protective cover 50 which has a flat surface on the top and extends into close contact with portions represented by hatching on the surface of print substrate 11. Protective cover 50 also includes three bosses each having threaded holes which are in register with through-holes 18a, 18b and 18c passing through print substrates 11 and 12 when assembled. In FIG. 2, only boss 62a and threaded hole 63a are shown since the other two bosses and the corresponding threaded holes are of the same construction. Protective cover 50 is fastened to print substrates 11 and 12 by means of screws 71a, 71b and 71c inserted into the respective threaded holes such as hole 63a in boss 62a.

In order to attach the electric circuit unit to predetermined portions of a body of a desired piece of equipment or the like, protective cover 50 further includes hook portions 64 and 65 which can engage the hook portions or engaging projections of such a body. In addition, protective cover 50 includes lugs 66 and 67 having through-holes 66a and 67a in register with threaded holes provided in given portions of such equipment and receive screws therein so as to accomplish a threaded connection therebetween.

Pins 68 and 69 properly locate flexible substrate 72 on protective cover 50. Flexible substrate 72 is placed on protective cover 50 by fitting through-holes 73 and 74 onto pins 68 and 69, respectively, and inserting the conductive pins into holes 72a and 19b in both members, and joining the substrate to the protective cover 50 such as by soldering, so that group of conductors 75 printed on the flexible substrate contact a group of terminals 19 on print substrate 11. In a similar manner, flexible substrate 76 is joined to print substrate 12 with the group of conductors 77 printed thereon connected to a group of terminals (not shown) on the print substrate.

Protective cover 50 further includes a projecting portion on the reverse surface thereof and along the left edge as viewed in FIG. 1. The projecting edge portion has step portion 50a as shown in FIG. 2 which engages the edges of print substrates 11 and 12 so as to regulate the position of these print substrates relative to the cover 50. The projecting edge portion also has portion 50b contacting flexible substrate 76 and having an outer surface presenting a curve as slow as drawing an arc of a given radius so that the undesired bending of flexible substrate 76 is avoided.

In assembling the electric circuit unit, holder elements 20, 30 and 40 for the movable switch contacts are secured to given respective portions of protective cover 50 and then the protective cover is fastened to plate 10 by means of screws 71a, 71b and 71c. Thus, holder elements 20 and 30, movable switch contacts 21, 22 and 31, 32 supported by these holders, and the groups of switch contacts 13 and 14 on which the movable contacts slide are sealed by print substrate 11 and protective cover 50 and are thus insulated from dust in the surroundings. For convenience in observing the connection between the switch terminals and the movable contacts from the exterior, protective cover 50 may be made of a transparent plastic.

Figure 3:
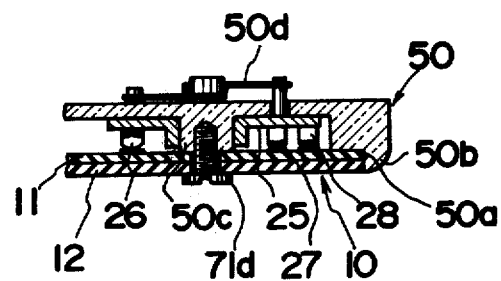
FIG. 3 is a cross-sectional view of the essential portion of an electric circuit unit according to another embodiment of the present invention.

FIG. 3 shows a joined portion of plate 10 with protective cover 50, and the movable-contact support portion thereof according to another embodiment of the present invention. In this embodiment, in order to fasten protective cover 50 to plate 10 by means of a screw 71d, boss 50c projecting from the reverse surface of protective cover 50 serves as a bearing for a holder element 25 for movable contacts so as to rotatably support the holder element. Rotation of the holder element 25 causes movable contacts 26, 27 and 28 to slide on print substrate 11. Holder 25 is biased in one direction by the force of spring 50d. Protective cover 50 has a projecting edge having a step portion 50a for regulating the position of plate 10 relative to the cover, and also includes curved portion 50b.

According to the present invention, both surfaces of a plate are utilized so as to minimize the dimensions of the unit which thereby results in a more compact electric circuit unit. The electrical circuit elements, according to the present invention, do not hinder adjustment of a switch portion of the unit since they are on opposite surfaces. Furthermore, the portions of the switch on the substrate are sealed by the protective cover so that defective electrical connections in the switches caused by the accumulation of dust or the like are effectively eliminated. In addition, the movable contacts of the switches are supported by the protective cover so that the electric circuit unit including these switches may be handled as an independent single unit. Consequently, mounting or demounting of the electric circuit unit in or from a camera body is facilitated.

While the present invention has been described with reference to particular embodiments thereof, it will be understood that numerous modifications may be made by those skilled in the art without actually departing from the spirit and scope of the invention as defined in the appended claims.

We claim:

1. An electric circuit unit which comprises a substrate having a front surface and a rear surface, said substrate being composed of two attached plate-like elements, the exposed surface of one plate-like element constituting the front surface of said substrate and the exposed surface of the second plate-like element constituting the rear surface of said substrate, said front surface of said substrate including a printed electrical circuit thereon which includes at least one group of switch terminals and said rear surface of said substrate including a multiplicity of electrical circuit elements and an additional electrical circuit printed thereon, said substrate including means to electrically connect said additional electrical circuit printed on said rear surface of said substrate with said electrical circuit printed on said front surface of said substrate, a cover means attached to said substrate, said cover means including portions capable of enclosing each group of switch terminals on said substrate front surface to protect them from the accumulation of dust, said cover means also including at least one opening therethrough for association with each set of switch terminals on said front surface of said substrate and a means for determining the positioning of said cover means with respect to said substrate, a movable contact means positioned between said cover means and each group of switch terminals on said front surface of said substrate, each movable contact means including an extension portion which extends through an associated opening in said cover means to extend beyond said cover means in a direction opposite said substrate, and multiple contact portions which are capable of electrically contacting the associated group of switch terminals on said front surface of said substrate, movement of each movable contact means by operation of each extension portion thereof acting to change the switch terminals contacted by the contact portions thereof.

2. The electric circuit unit of claim 1, wherein said cover means includes at least one boss portion extending toward said substrate, and wherein connection means interconnect each said boss portion to said substrate.

3. The electric circuit unit of claim 2, wherein at least one movable contact means is pivotally supported by a boss portion of said cover means.

4. The electric circuit unit of claim 1, wherein said cover means is transparent.

5. The electric circuit unit of claim 1, wherein at least one of said openings in said cover means is slot-shaped.

6. The electric circuit unit of claim 1, wherein at least two openings in said cover means are associated with each group of switch terminals on said front surface of said substrate, one being circular and another being arcuate, wherein a bearing means is attached to the outer side of said cover means to enclose each circular opening therein, wherein the extension portion of each movable contact means is cylindrical in shape and extends through an associated circular opening in said cover means so as to be rotatably supported by a respective bearing means, and wherein each bearing means includes a control pin which extends into an associated arcuate opening in said cover means to control the rotational positioning of said bearing means and its associated contact means.

7. The electric circuit unit of claim 1, wherein said cover means is composed of an electrically-insulating material.

8. The electric circuit unit of claim 1, wherein said electrical circuit elements attached to the rear surface of said substrate are selected from the group consisting of resistors, capacitors, and semiconductor elements.

* * * * *